United States Patent
Robertson

(10) Patent No.: US 6,378,032 B1
(45) Date of Patent: Apr. 23, 2002

(54) BANK CONFLICT AVOIDANCE IN MULTI-BANK DRAMS WITH SHARED SENSE AMPLIFIERS

(75) Inventor: Iain Robertson, Beds (GB)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 09/616,279

(22) Filed: Jul. 14, 2000

(51) Int. Cl.[7] ............................................... G06F 12/10
(52) U.S. Cl. ........................... 711/5; 711/203; 711/210; 711/217; 365/230.03
(58) Field of Search .............................. 711/5, 202, 203, 711/209, 210, 217, 218; 365/230.03

(56) References Cited

U.S. PATENT DOCUMENTS 6,144,577 A  * 11/2000 Hidaka .................. 365/230.03

* cited by examiner

Primary Examiner—Jack A. Lane
(74) Attorney, Agent, or Firm—J. Dennis Moore; W. James Brady, III; Frederick J. Telecky, Jr.

(57) ABSTRACT

Data transfers involving accesses of multiple banks of a DRAM having a shared sense amplifier architecture can be performed while also avoiding bank conflicts and associated data bus latency. Groups of DRAM banks which can be sequentially accessed during a given data transfer without conflicting with one another are identified and utilized for data transfers. Each data transfer sequentially accesses the banks of one of the groups. The sequence in which the banks of a given group will be accessed during a data transfer can advantageously be reordered in order to prevent conflicts with banks that have been or will be accessed during prior or subsequent data transfers. In this manner, consecutive data transfers, each involving accesses to multiple banks of a DRAM having a shared sense amplifier architecture, can be performed without any data bus latency between or within the transfers.

25 Claims, 4 Drawing Sheets

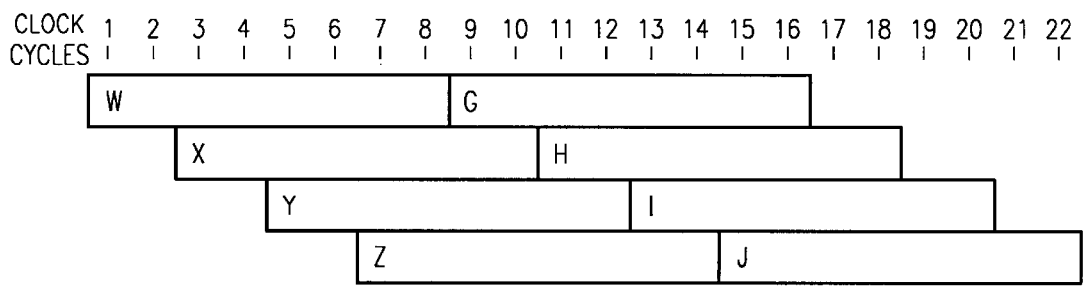
FIG. 1
FIG. 2
FIG. 3
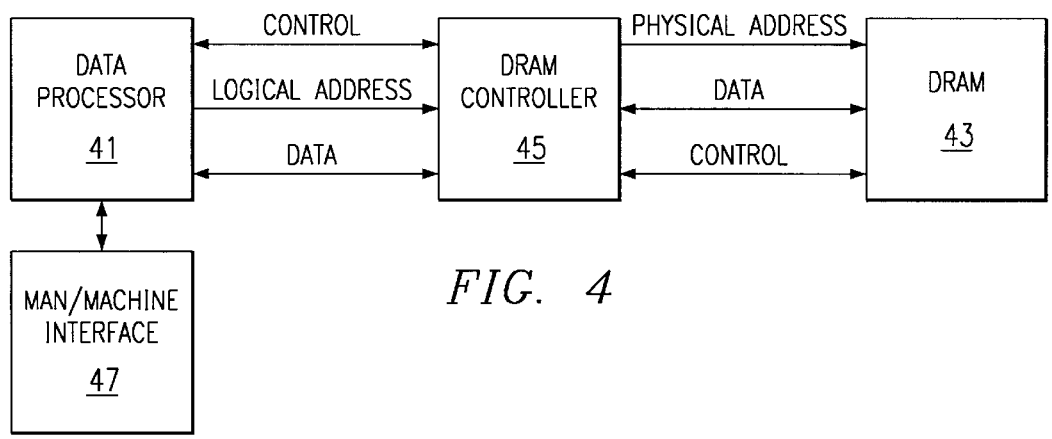
FIG. 4

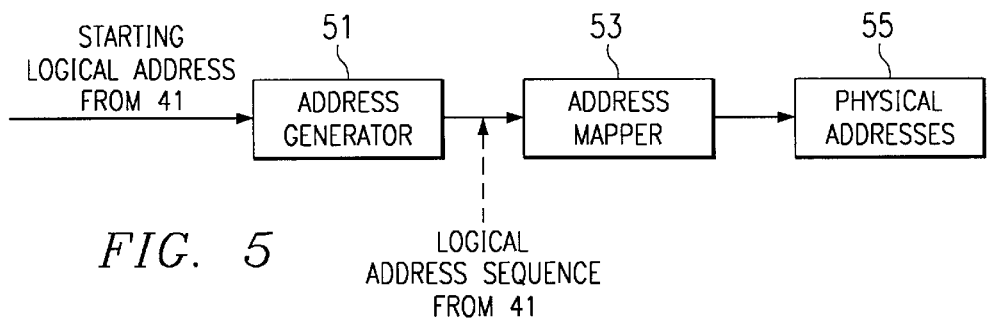
FIG. 5
| BANK ACCESSED | L6 | L5 | L4 | B3 | B2 | C0 |
|---|---|---|---|---|---|---|
| W (1ST DUALOCT) | 0 | 0 | 0 | 0 | 0 | 0 |
| W (2ND DUALOCT) | 0 | 0 | 1 | 0 | 0 | 1 |
| X (1ST DUALOCT) | 0 | 1 | 0 | 0 | 1 | 0 |
| X (2ND DUALOCT) | 0 | 1 | 1 | 0 | 1 | 1 |
| Y (1ST DUALOCT) | 1 | 0 | 0 | 1 | 0 | 0 |
| Y (2ND DUALOCT) | 1 | 0 | 1 | 1 | 0 | 1 |
| Z (1ST DUALOCT) | 1 | 1 | 0 | 1 | 1 | 0 |
| Z (2ND DUALOCT) | 1 | 1 | 1 | 1 | 1 | 1 |
FIG. 6
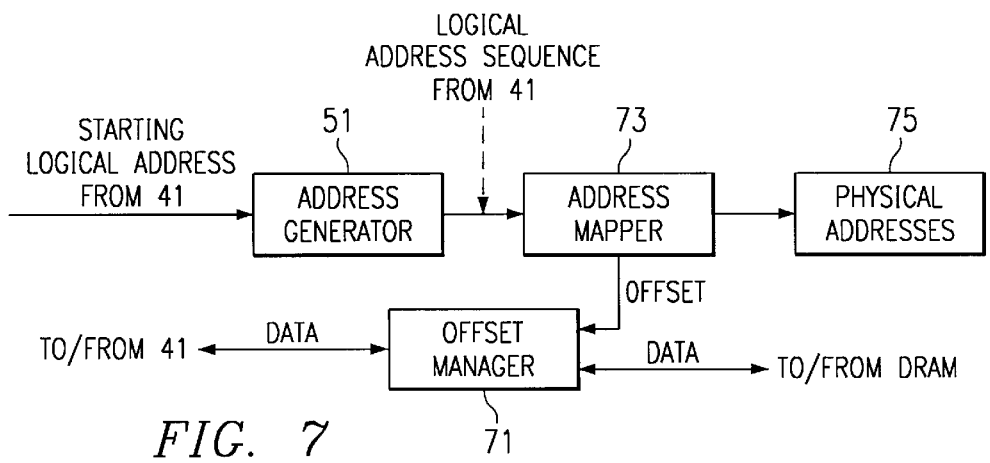
FIG. 7

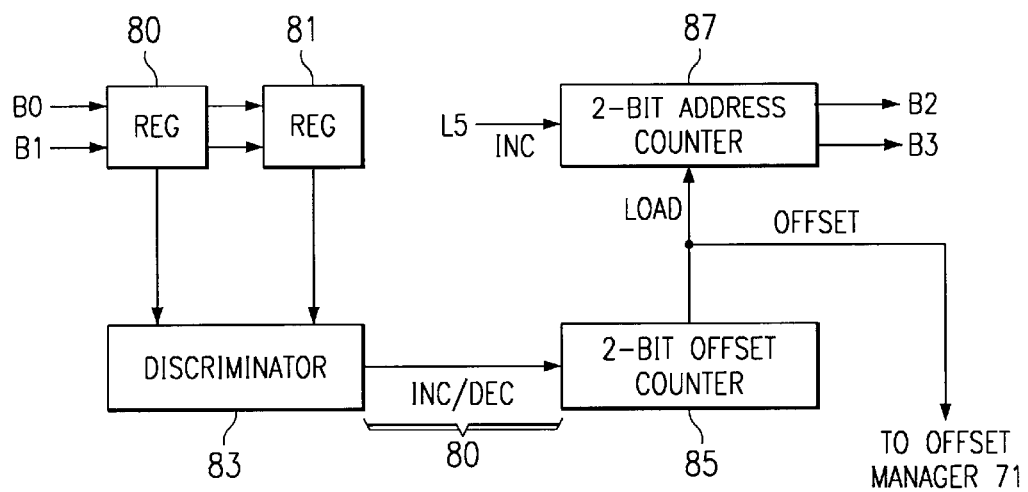
FIG. 8
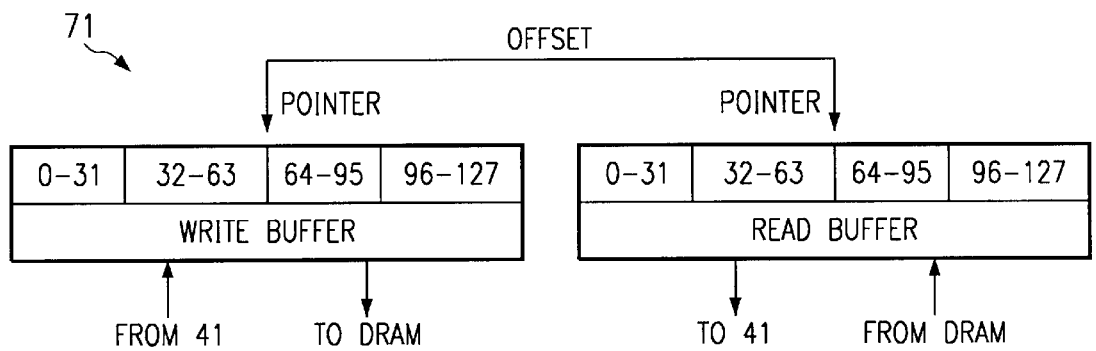
FIG. 9
| OFFSET | BYTE SEQUENCE TO/FROM DRAM |
|---|---|
| 00 | 0–31; 32–63; 64–95; 96–127 |
| 01 | 32–63; 64–95; 96–127; 0–31 |
| 10 | 64–95; 96–127; 0–31; 32–63 |
| 11 | 96–127; 0–31; 32–63; 64–95 |
FIG. 11

BANK CONFLICT AVOIDANCE IN MULTI-BANK DRAMS WITH SHARED SENSE AMPLIFIERS

FIELD OF THE INVENTION

The invention relates generally to data transfers to or from a DRAM and, more particularly, to data transfers involving a multi-bank DRAM that utilizes shared sense amplifiers.

BACKGROUND OF THE INVENTION

Many conventional DRAM devices utilize shared sense amplifier architectures. A typical example is a DRAM having a plurality of separate memory banks, each of which shares sense amplifiers with two adjacent memory banks. For example, half of bank n shares sense amplifiers with half of bank n−1, and the other half of bank n shares sense amplifiers with half of bank n+1. Due to this shared sense amplifier architecture, when bank n is open, a subsequent access to a different row in bank n, or to any row in bank n−1 or bank n+1, cannot be started without first closing bank n. If such a subsequent access is attempted before bank n is closed, a bank conflict occurs.

In some exemplary DRAMs having shared sense amplifier architectures, for example, in Direct RDRAMs produced according to the RDRAM specification from Rambus, all data transfers to the DRAM from an external source or from the DRAM to an external destination are performed in blocks of 128 bytes. In a typical bank access cycle, either 16 or 32 bytes from the memory bank can be accessed. Thus, a 128 byte transfer can be performed, for example, by 8 accesses of 16 bytes or 4 accesses of 32 bytes. However, bank conflicts as described above can cause stalls to occur (waiting for a bank to close) during the 128 byte data transfer, thus disadvantageously degrading data bus utilization (i.e., increasing data bus latency) during the data transfer.

It is therefore desirable to provide for accessing multiple banks of a shared sense amplifier DRAM during a data transfer (or a plurality of consecutive data transfers) without bank conflicts and the associated stalls.

The present invention permits consecutive data transfers, each involving accesses of multiple DRAM banks, to be performed without any bank conflict-related stalling between or within transfers. In particular, the invention identifies groups of banks, each group including a plurality of constituent banks that can be sequentially accessed during a given data transfer without conflicting with one another. Each data transfer sequentially accesses the banks of one of the groups. The invention also provides for selectively reordering the sequence in which the banks of a given group will be accessed during a data transfer. This reordering can prevent conflicts with banks accessed during prior or subsequent data transfers.

BRIEF DESCRIPTION OF THE DRAWINGS

FIG. 1 is a timing diagram which illustrates an example of two consecutive DRAM data transfers including multiple bank accesses according to the invention.

FIG. 2 illustrates exemplary groups of memory banks which can be sequentially accessed to accomplish the data transfers of FIG. 1.

FIG. 3 illustrates an example of mapping logical addresses into physical addresses to utilize the bank groups of FIG. 2.

FIG. 4 diagrammatically illustrates exemplary embodiments of a data processing system according to the invention.

FIG. 5 diagrammatically illustrates pertinent portions of an exemplary embodiment of the DRAM controller of FIG. 4.

FIG. 6 illustrates an example of address bit mapping that can be performed by the address mapper of FIG. 5.

FIG. 7 diagrammatically illustrates pertinent portions of a further exemplary embodiment of the DRAM controller of FIG. 4.

FIG. 8 diagrammatically illustrates pertinent portions of an exemplary embodiment of the address mapper of FIG. 7.

FIG. 9 diagrammatically illustrates an exemplary embodiment of the offset manager of FIG. 7.

FIG. 11 illustrates exemplary relationships between bank offset values and data transfer sequences according to the invention.

DETAILED DESCRIPTION

Figure 10:
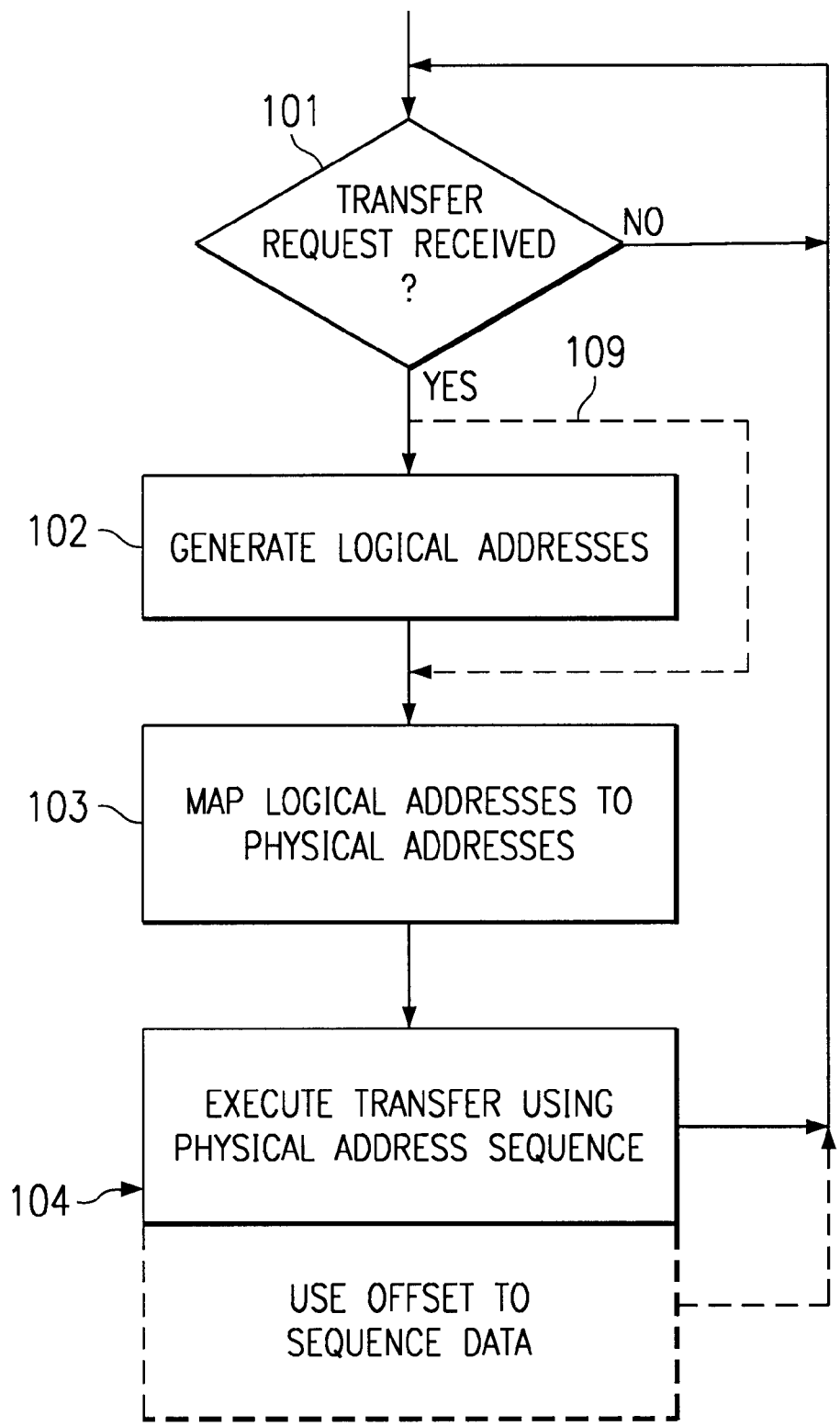
FIG. 10 illustrates exemplary operations which can be performed by the DRAM controller embodiments of FIGS. 3–9.

FIG. 1 illustrates an example of two consecutive 128 byte data transfers to or from a DRAM according to the principles of the present invention. The first 128 byte data transfer includes four timewise overlapping accesses of DRAM memory banks W, X, Y and Z. Similarly, the second 128 byte data transfer includes four timewise overlapping accesses of DRAM memory banks G, H, I and J. Because each 128 byte data transfer is spread across four memory banks, each memory bank access is a 32 byte access.

As can be seen from FIG. 1, the two consecutive 128 byte data transfers are advantageously timewise adjacent to one another with no stall between them. This can occur as long as there are no bank conflicts between the banks used for the first and second data transfers. For example, the access of bank G at the start of the second transfer GHIJ would be delayed by two clock cycles if bank G was the same as any of banks X, X+1, or X−1, and would be delayed by 6 cycles if bank G was the same as any of banks Z, Z+1, or Z−1. On the other hand, if bank G did not conflict with any of the bank accesses in the transfer WXYZ but, for example, if bank H was the same as any of banks Y, Y+1, or Y−1, then the second transfer GHIJ would not stall on the access to bank G, but would stall for two cycles before accessing bank H.

FIG. 2 illustrates four exemplary memory bank groups, each memory bank group consisting of four memory banks. As shown in FIG. 2, memory bank group 0 includes memory banks 0, 4, 8 and 12, memory bank group 1 includes memory banks 1, 5, 9 and 13, memory bank group 2 includes memory banks, 2, 6, 10 and 14, and memory bank group 3 includes memory banks 3, 7, 11 and 15. FIG. 2 also illustrates exemplary correspondences between the memory banks of the illustrated memory bank groups and the memory banks designated in the example of FIG. 1. For example, the two timewise adjacent data transfers illustrated in FIG. 1 can be accomplished without any bank conflicts and consequent stalling if the first data transfer WXYZ is spread across the banks 0, 4, 8 and 12 of group 0 and the second data transfer GHIJ is spread across the banks 1, 5, 9 and 13 of group 1. In this example, W=0, X=4, Y=8, Z=12, G=1, H=5, I=9, and J=13.

Consider, for example, a 64 megabit DRAM with 16 banks and a minimum transfer size of 16 bytes. Such a DRAM includes $2^{26}$ bits, which is $2^{23}$ bytes, so 23 logical address bits are required to address a given byte in the DRAM. However, because the minimum transfer size in this example is 16 bytes, the four least significant bits of the logical address are not needed, because these bits only address selected bits within a given 16 byte block of data. A 16 byte block of data is also referred to herein as a dualoct.

Because the DRAM in this example has 16 banks, four physical address bits are required to select the bank. Furthermore, each bank in this example contains four megabits, arranged as 32,000 dualocts. Thus, 15 physical address bits are required to address a given dualoct within a given memory bank. Therefore, a total of 4+15=19 physical address bits are necessary to address a given dualoct, which matches the aforementioned total of 19 (23–4) logical address bits. Further in the aforementioned exemplary DRAM, the 32,000 dualocts of each bank will typically be arranged as a two dimensional matrix of $2^A$ rows and $2^B$ columns, where A+B=15. Assume for this example that A=8 and B=7, that is 256 rows and 128 columns.

There are eight dualocts in a 128 byte data transfer. Recalling from FIG. 1 that each 128 byte transfer is spread across four memory banks, two dualocts in each of the four memory banks are accessed during each transfer, for a total of 4×2×16=128 bytes in each transfer. Conventional 64 megabit DRAMs such as the Rambus R DRAM support two 16 byte transfers per bank access, which capability is exploited by the present invention to spread a 128 byte transfer across four data banks.

Referring now again to the 23 logical address bits required to address a given byte, these bits are designated herein as L0–L22 from least to most significant. For the first byte of a 128 byte data transfer, the seven least significant bits of the logical address, namely L0–L6, will be 0000000. Similarly, for the last byte of the 128 byte data transfer, address bits L0–L6=1111111. All logical address bits more significant than L0–L6, namely L7–L22 are unchanging within a 128 byte data transfer (but can change from one transfer to the next). As mentioned above, when addressing 16 byte dualocts, the least significant four bits of the logical address, namely L0–L3, are not needed. Thus, for purposes of mapping the logical address into a physical address, only 19 logical address bits, L4–L22, need be considered, and only the least significant three of those address bits, namely address bits L4–L6, will change during a 128 byte transfer.

FIG. 3 illustrates an exemplary mapping of logical addresses to physical addresses according to the invention. Logical address bits L0–22 are shown in the left column of FIG. 3. Seven column address bits C0–C6 (from least to most significant), eight row address bits R0–R7 (from least to most significant), and four bank select bits B0–B3 (from least to most significant) are shown in the right column of FIG. 3. In the illustrated example, logical address bit L4 is mapped to column address bit C0, logical address bit L5 is mapped to bank select bit B2, logical address bit L6 is mapped to bank select bit B3, logical address bit L7, is mapped to bank select bit B0 and logical address bit L8 is mapped to bank select bit B1. Also, logical address bits L9–L14 are respectively mapped onto column address bits C1–C6, and logical address bits L15–L22 are mapped respectively onto row address bits R0–R7. Recall that, among the logical address bits L4–L22 that will be mapped into physical address bits, only the three least significant bits L4–L6 will change during a 128 byte transfer. By mapping the two most significant of these three bits, namely L6 and L5, onto the two most significant bank select bits B3 and B2, the present invention spreads the 128 byte data transfer across 4 banks selected by bits L6 and L5.

Logical and physical addressing during exemplary 128 byte transfers according to the invention are illustrated diagrammatically in FIG. 6, with reference to the transfers WXYZ and GHIJ of FIG. 1. In the example of FIG. 6, while B3=0 and B2=0, memory bank W is selected. While bank W is selected, the first dualoct is accessed from a first column of bank W when C0=0, and the second dualoct is accessed from an adjacent column of bank W when C0=1. When B3=0 and B2=1, bank X is selected and the first and second dualocts are respectively accessed when C0=0 and C0=1. Because logical address bits L5 and L6 have been mapped onto the most significant two bits B2 and B3 of the four bank select bits, the four banks W, X, Y and Z that are accessed in FIG. 6 are spread evenly throughout the range of 16 banks. Referring to the values of B3 and B2 in FIG. 6, the bank changes occur between the second and third physical addresses (B3B2 changes from 00 to 01), the fourth and fifth physical addresses (B33B2 changes from 01 to 10), and the sixth and seventh physical addresses (B3B2 changes from 10 to 11). With this address mapping, no bank conflicts can occur within a 128 byte data transfer spread across the four memory banks W, X, Y and Z. In particular, the mapping of logical address bits L5 and L6 onto the two most significant bank select bits B2 and B3 insures that a given 128 byte transfer is spread across the four banks of one of the four bank groups illustrated in FIG. 2. The two least significant bank select bits B0 and B1 (which do not change during a 128 byte transfer) determine which of the four bank groups is used. More specifically, bank group 0 is used when B0=B1=0, bank group 1 is used when B0=1 and B1=0, bank group 2 is used when B0=0 and B1=1, and bank group 3 is used when B0=B1=1.

FIG. 4 diagrammatically illustrates exemplary embodiments of a data processing system according to the present invention which can perform consecutive data transfers such as described above relative to FIGS. 1–3 and 6. The system of FIG. 4 includes a data processor 41 (e.g. a microprocessor or digital signal processor) for performing data processing operations. The data processor 41 is coupled via a DRAM controller 45 to a DRAM 43 having a shared a sense amplifier architecture. The DRAM 43 stores data involved in the data processing operations of the data processor 41. The data processor 41 provides logical addresses to the DRAM controller 45, and exchanges data and conventional control information with the DRAM controller 45. In response to logical addresses received in data transfer requests from the data processor 41, the DRAM controller 45 provides physical addresses to the DRAM 43. The DRAM controller 45 also exchanges data and conventional control information with the DRAM 43 in order to execute data transfers requested by the data processor 41. A man/machine interface 47 is coupled to the data processor 41 to permit human interaction with the system. In various exemplary embodiments, the data processor 41, DRAM 43 and DRAM controller 45 could be provided together on a single semiconductor integrated circuit chip, or could be provided, in various combinations, on multiple interconnected semiconductor integrated circuit chips. Examples of the man/machine interface 47 include a keyboard, a mouse, a video display, a printer, etc.

FIG. 5 diagrammatically illustrates pertinent portions of an exemplary embodiment of the DRAM controller 45 of FIG. 4. In the embodiment of FIG. 5, an address generator 51 receives from the data processor 41 the starting logical address of a 128 byte data transfer requested by the data processor 41. The address generator 51 generates seven additional logical addresses by incrementing the starting address, thereby producing a logical address sequence for the data transfer. In the example of FIG. 6, the starting address of the sequence has bits L4=L5=L6=0, and seven additional logical addresses of the sequence are produced by incrementing from L4=L5=L6=0 through L4=L5=L6=1. The address generator 51 passes the eight logical addresses to an address mapper 53 which can implement, for example, the address mapping illustrated in the examples of FIGS. 3 and 6. In other embodiments, the entire logical address sequence can be provided to the address mapper 53 directly from the data processor 41 in the transfer request, as shown by broken line in FIG. 5. The address mapper outputs eight physical addresses 55 which define a physical address sequence that corresponds to the logical address sequence and can be used by the DRAM controller 45, together with conventional DRAM control signals, to perform a 128 byte data transfer spread across four memory banks at 32 bytes per bank.

Referring again to FIGS. 1 and 2, if transfers are always performed in the ascending bank order suggested by these figures, conflicts can still occur. For example, if a transfer using bank group 0 (W=0, X=4, Y=8 and Z=12) is followed by a transfer using bank group 3 (G=3, H=7=, I=11, and J=15), a conflict will occur because, for example, bank 3 (G in FIG. 1) of the second transfer GHIJ conflicts with bank 4 (X in FIG. 1) of the first transfer WXYZ. Thus, bank 3 cannot be opened until bank 4 is closed, thereby clearly resulting in a stall between the transfers WXYZ and GHIJ in FIG. 1. A similar bank conflict arises if a transfer using bank group 0 of FIG. 2 follows a transfer using bank group 3, for example, G=0 in transfer GHIJ of FIG. 1 conflicts with Z=15 in transfer WXYZ.

The present invention can avoid the aforementioned conflict when a transfer using one of bank groups 0 and 3 follows a transfer using the other of bank groups 0 and 3. This is achieved by providing for selectability as to which bank will be the starting bank of a data transfer using a given bank group. Referring again to FIGS. 1 and 2, if a transfer involving bank group 3 follows a transfer involving bank group 0, bank conflicts can be avoided by, for example, beginning the GHIJ transfer at bank 15 of group 3 rather than at bank 3. That is, in FIG. 1, G=15, H=3, I=7 and J=11. By thusly re-ordering the bank access sequence within group 3, the GHIJ transfer of FIG. 1 provides no bank conflicts with the WXYZ transfer of FIG. 1, where W=0, X=4, Y=8 and Z=12. Thus, bank conflicts between consecutive data transfers involving bank groups 0 and 3 of FIG. 2 can be avoided by implementing a bank offset that selects which bank will be the starting bank of the selected bank group.

The bank offset can be implemented using a two-bit offset counter which is incremented by one when a transfer using bank group 0 follows a transfer using bank group 3, and is decremented by one when a transfer using bank group 3 follows a transfer using bank group 0. The value of this two-bit offset determines the order in which the banks of a given group are accessed. More particularly, if the offset is 00, then the most significant bank select bits B3B2 would cycle in the order 00, 01, 10, 11. For an offset of 01, bank select bits B3B2 would cycle in the order 01, 10, 11, 00. For an offset of 10, bits B3B2 would cycle in the order 10, 11, 00, 01. For an offset of 11, bits B3B2 would cycle in the order 11, 00, 01, 10. Thus, if the offset is initially 00, and if a transfer involving bank group 3 follows a transfer involving bank group 0, then the offset counter would be decremented from 00 to 11, thus causing the data transfer to cycle through the banks of bank group 3 in the reordered sequence of 15, 3, 7, 11. As discussed above, a transfer that accesses the banks of group 3 in this order does not conflict with an immediately preceding transfer that accesses the banks of group 0 in the order 0,4,8,12.

It can be seen from the foregoing discussion that the value of the 2-bit offset always matches the bank select bits B3B2 that define the first bank accessed in the 128 byte transfer. Thus, bits B3 and B2 can be easily controlled by using the offset value in conjunction with a dedicated 2-bit counter. This is described in more detail below.

FIG. 7 diagrammatically illustrates pertinent portions of a further exemplary embodiment of the DRAM controller 45 of FIG. 4. The embodiment of FIG. 7 is generally similar to the embodiment of FIG. 5, but includes an address mapper 73 that implements the bank offset, and also includes an offset manager 71 that compensates for the effect of offsets on the data being transferred. In the embodiment of FIG. 7, the logical address sequence can be provided to the address mapper 73 in the same manner described generally above relative to FIG. 5. The address mapper 73 maps the logical addresses into physical addresses 75. The address mapper also outputs the offset to the offset manager 71. The offset manager 71 is coupled for bidirectional data communication with the DRAM and the data processor 41, and is operable to render the DRAM controller's use of offsets transparent to the data processor.

FIG. 8 illustrates pertinent portions of an exemplary embodiment of the address mapper 73 of FIG. 7. In the embodiment of FIG. 8, physical address bit B0 and B1, as determined for example from the mapping illustrated in FIG. 3, are input to a two stage register at 81 and 82, thereby maintaining a record of the bits B0 and B1 of the current data transfer (e.g. GHIJ of FIG. 1) and the immediately preceding data transfer (e.g. WXYZ of FIG. 1). The two-stage register is coupled to an offset determiner 80 which determines an offset for the current transfer. The offset determiner includes a discriminator 83 and a 2-bit counter 85. The bits B0 and B1 from the current data transfer are loaded from register 80 into the discriminator 83, and the bits B0 and B1 from the immediately preceding data transfer are loaded from the register 81 to the discriminator 83.

The discriminator 83 determines from the information in registers 80 and 81 whether the current data transfer uses bank group 0 and the immediately preceding data transfer used bank group 3, or whether the current data transfer uses bank group 3 and the immediately preceding data transfer used bank group 0. If the discriminator 83 determines that a transfer using bank group 3 follows a transfer using bank group 0, then it outputs a decrement signal to the 2-bit offset counter 85. If the discriminator 83 determines that a data transfer using bank group 0 follows a data transfer using bank group 3, then the determinator 83 outputs an increment signal to the 2-bit offset counter 85. If the information in either of the registers 80 and 81 corresponds to a bank group other than group 0 or group 3, the discriminator output remains inactive so that the offset counter 85 retains its current state.

The offset counter 85 outputs the 2-bit offset value of the current data transfer to the load input of a 2-bit address counter 87 that is incremented whenever the value of logical address bit L5 toggles (see also FIG. 6). The count output of the address counter 87 provides bank select bits B2 and B3. Thus, the address mapper 73 of FIG. 7 does not map bank select bits B3 and B2 in the same fashion as the address mapper 53 of FIG. 5, but rather produces these bank select bits in response to the B0 and B1 values of the current transfer and the immediately preceding transfer, and also in response to the changes in logical address bit L5. Other than this difference in the generation of bank select bits B3 and B2, the address mapper 73 of FIG. 7 can operate generally in the same manner described above with respect to the address mapper 53 of FIG. 5. The offset value of the current data transfer, as output from the offset counter 85, is also provided to the offset manager 71 of FIG. 7.

FIG. 9 diagrammatically illustrates an exemplary embodiment of the offset manager 71 of FIG. 7. During a DRAM write operation, the 128 data bytes provided by the data processor 41 are loaded into a write buffer according to a predetermined format, for example, in order of ascsending logical addresses from the byte with the lowest logical address (byte 0) to the byte with the highest logical address (byte 127). The offset value is used as a pointer that specifies the sequence in which the bytes are to be transferred from the write buffer to the DRAM. The offset pointer insures that the bytes in the write buffer are always written to the DRAM as follows: bytes 0–31 to the bank addressed by B3B2=00; bytes 32–63 to the bank addressed by B3B2=01; bytes 64–95 to the bank addressed by B3B2=10; and bytes 96–127 to the bank addressed by B3B2=11. For an offset of 00, the B3B2 sequence for the write operation is 00,01, 10, 11, so the bytes are transferred from the write buffer to the DRAM in the sequence 0–31, 32–63, 64–95, 96–127. For an offset of 01, the B3B2 sequence is 01, 10, 11, 00, so the byte transfer sequence from the buffer to the DRAM is 32–63, 64–95, 96–127, 0–31. For an offset of 10, the B3B2 sequence is 10, 11, 00, 01, so the byte transfer sequence from the write buffer to the DRAM is 64–95, 96–127, 0–31, 32–63. For an offset of 11,the B3B2 sequence is 11, 00, 01, 10, so the byte transfer sequence from the write buffer to the DRAM is 96–127, 0–31, 32–63, 64–95.

For DRAM write operations, because it is known that bytes 0–31, bytes 32–63, bytes 64–95 and bytes 96–127 have been respectively written to the banks defined by B3B2=00, B3B2=01, B3B2=10 and B3B2=11, the offset value can also be used as a pointer to specify where the bytes read from the DRAM are to be loaded into a read buffer in the offset manager of FIG. 9. For example, an offset of 00 indicates that the aforementioned data bytes 0–31, 32–63, 64–95 and 96–127 that were previously written to the DRAM will be received from the DRAM in the sequence 0–31, 32–63, 64–95, 96–127, an offset of 01 indicates that the bytes will be received from the DRAM in the sequence 32–63, 64–95, 96–127, 0–31, an offset of 10 indicates that the bytes will be received from the DRAM in the sequence 64–95, 96–127, 0–31, 32–63, and an offset of 11 indicates that the bytes will be received from the DRAM in the sequence 96–127, 0–31, 32–63, 64–95. In this manner, the offset value completely specifies where the data bytes received from the DRAM should be stored in the read buffer in order to match the predetermined format in which they were previously loaded into the write buffer (when they were written to the DRAM).

FIG. 11 illustrates in tabular format the above-described exemplary relationship between the offset value and the sequence in which the data bytes are written to or read from the DRAM.

In some embodiments, the offset manager 71 of FIGS. 7 and 9 is provided in the data processor 41 of FIG. 4, and the read and write buffers are part of the memory of the data processor 41. The data processor 41 can provide the address of the buffers to the DRAM controller along with the logical address.

FIG. 10 illustrates exemplary operations which can be performed by the embodiments of the FIGS. 3–9. When at 101 the DRAM controller receives from the data processor a transfer request including the starting logical address of the transfer, the logical address sequence for the transfer is generated at 102. In embodiments wherein the logical address sequence is provided in the transfer request, generation of the logical address sequence can be omitted, as shown by broken line 109 in FIG. 10. At 103, the logical addresses of the logical address sequence are mapped onto respective physical addresses to produce a corresponding physical address sequence, and the data transfer is executed at 104 according to the physical address sequence. In embodiments which utilize bank offsets (illustrated by the broken line portion of block 104), the offset is used to sequence the data, for example, as described above relative to FIGS. 9 and 11.

The above-described exemplary embodiments of the invention provide for consecutive 128 byte transfers to/from a DRAM having a shared sense amplifier architecture, and without any bank conflict-related stalling between or within transfers. The invention can advantageously be implemented by suitably mapping logical addresses onto physical addresses for use by the DRAM. It should be clear that the aforementioned dimensions of the DRAM, size of the data transfers and size of the bank accesses are exemplary only, as are the number of accesses per bank. The invention can also be applied where any one or more of the DRAM dimensions, the data transfer and bank access sizes, and the number of accesses per bank differ from those described above.

Although exemplary embodiments of the invention are described above in detail, this does not limit the scope of the invention, which can be practiced in a variety of embodiments.

What is claimed is:

1. A method of controlling a data transfer involving a multi-bank DRAM having a shared sense amplifier architecture, comprising:

providing a plurality of logical addresses that define a logical address sequence to be used in the data transfer;

mapping the logical addresses of the logical address sequence into respective physical addresses that define a physical address sequence that corresponds to the logical address sequence and includes a plurality of pairs of first and second physical addresses that are mutually adjacent addresses in the physical address sequence, said mapping step including assigning the first and second physical addresses in each of said pairs such that the first physical address points to a first location in a first bank of the DRAM and the second physical address points to a second location in a second bank of the DRAM that differs from and does not share sense amplifiers with the first bank; and performing the data transfer according to the physical address sequence, including using the physical addresses of the physical address sequence to access sequentially locations of the DRAM that are respectively pointed to by the physical addresses of the physical address sequence.

2. The method of claim 1, wherein said mapping step includes spacing said pairs of first and second physical addresses evenly throughout the physical address sequence.

3. The method of claim 1, wherein said mapping step includes selecting as a beginning address of the physical address sequence a physical address other than the physical addresses that constitute said pairs of physical addresses.

4. The method of claim 1, wherein said using step includes accessing two memory locations in each of the first and second banks of the DRAM.

5. The method of claim 1, wherein said mapping step includes selecting one of said physical addresses to be a beginning physical address of the physical address sequence in response to a first condition, and selecting another of said physical addresses to be the beginning physical address of the physical address sequence in response to a second condition.

6. The method of claim 5, wherein said mapping step includes establishing an offset for the data transfer based on the banks of the DRAM addressed by the physical addresses of the physical address sequence and also based on the banks of the DRAM that were addressed by physical addresses of a previous physical address sequence used in a previous data transfer involving the DRAM, wherein said offset is indicative of said beginning physical address, and wherein said first and second conditions correspond respectively to first and second values of said offset.

7. The method of claim 6, wherein said mapping step includes determining a portion of each said physical address in the physical address sequence based on said offset.

8. The method of claim 6, including, for a first data transfer that is a to write data to the DRAM, providing a data block to be written to the DRAM and using the offset associated with the first data transfer to establish corresponding relationships between said physical addresses and respective portions of said data block, and for a second data transfer that is to read said data block from the DRAM, using said corresponding relationships and the offset associated with the second data transfer to reproduce from the DRAM said data block as provided in said data block providing step.

9. The method of claim 1, wherein said mapping step includes determining a first portion of one of said physical addresses, and determining a second portion of said one physical address in response to said first portion thereof.

10. The method of claim 9, wherein said determining step includes determining said second portion of said one physical address in response to said first portion thereof and also in response to a portion of a physical address used in a previous data transfer involving the DRAM.

11. The method of claim 1, wherein said mapping step includes determining a first portion of one of said physical addresses in response to a portion of a physical address used in a previous data transfer involving the DRAM.

12. An apparatus for controlling a data transfer involving a multi-bank DRAM having a shared sense amplifier architecture, comprising:

an input for receiving a plurality of logical addresses that define a logical address sequence to be used in the data transfer;

an address mapper coupled to said input for mapping the logical addresses of the logical address sequence into respective physical addresses that define a physical address sequence that corresponds to the logical address sequence and includes a plurality of pairs of first and second physical addresses that are mutually adjacent addresses in the physical address sequence, said address mapper further for assigning the first and second physical addresses in each of said pairs such that the first physical address points to a first location in a first bank of the DRAM and the second physical address points to a second location in a second bank of the DRAM that differs from and does not share sense amplifiers with the first bank; and an output for coupling to a DRAM to permit performance of the data transfer according to the DRAM locations that are respectively pointed to by the physical addresses of the physical address sequence.

13. The apparatus of claim 12 wherein said address mapper is operable for selecting one of said physical addresses to be a beginning physical address of the physical address sequence in response to a first condition, and is further operable for selecting another of said physical addresses to be the beginning physical address of the physical address sequence in response to a second condition.

14. The apparatus of claim 13, wherein said address mapper includes a further input for receiving information indicative of the banks of the DRAM addressed by the physical addresses of the physical address sequence and information indicative of the banks of the DRAM that were addressed by physical addresses of a previous physical address sequence used in a previous data transfer involving the DRAM, and an offset determiner coupled to said further input for establishing an offset for the data transfer based on said information, wherein said offset is indicative of said beginning physical address, and wherein said first and second conditions correspond respectively to first and second values of said offset.

15. The apparatus of claim 14, wherein said address mapper includes an address producing apparatus coupled to said offset determiner for producing a portion of each said physical address in the physical address sequence based on said offset.

16. The apparatus of claim 15, wherein said address producing apparatus includes a counter having a load input coupled to said offset determiner to receive said offset, and having an increment input coupled to said first-mentioned input to receive therefrom a portion of each said logical address.

17. The apparatus of claim 14, including an offset manager coupled to said offset determiner and having an input buffer for receiving a data block to be written to the DRAM, said offset manager operable during a first data transfer that is to write said data block to the DRAM for using the offset associated with the first data transfer to establish corresponding relationships between said physical addresses and respective portions of said data block, said offset manager having an input for receiving data from the DRAM, said offset manager operable during a second data transfer that is to read said data block from the DRAM for using said corresponding relationships and the offset associated with the second data transfer to reproduce from the DRAM said data block as it was provided to said input buffer.

18. The apparatus of claim 12, wherein said address mapper is operable to determine a first portion of one of said physical addresses in response to a second portion of said one physical address.

19. The apparatus of claim 18, wherein said address mapper is further operable to determine said first portion of said one physical address also in response to a portion of a physical address used in a previous data transfer involving the DRAM.

20. The apparatus of claim 12, wherein said address mapper is operable to determine a first portion of one of said physical addresses in response to a portion of a physical address used in a previous data transfer involving the DRAM.

21. A data processing system, comprising:

a data processor for performing data processing operations;

a multi-bank DRAM having a shared sense amplifier architecture for storing therein data involved in said data processing operations; and a memory controller coupled between said data processor and said DRAM for permitting data transfers therebetween, said memory controller including an input coupled to said data processor for receiving therefrom a data transfer request, an address mapper coupled to said input and responsive to said data transfer request for mapping logical addresses of a logical address sequence associated with said data transfer request into respective physical addresses that define a physical address sequence that corresponds to the logical address sequence and includes a plurality of pairs of first and second physical addresses that are mutually adjacent addresses in the physical address sequence, said address mapper further for assigning the first and second physical addresses in each of said pairs such that the first physical address points to a first location in a first bank of the DRAM and the second physical address points to a second location in a second bank of the DRAM that differs from and does not share sense amplifiers with the first bank, and an output coupled to said address mapper and said DRAM for controlling the requested data transfer according to said physical address sequence by using the physical addresses of the physical address sequence to access sequentially locations of the DRAM that are respectively pointed to by the physical addresses of the physical address sequence.

22. The system of claim 21, provided as a single semiconductor integrated circuit.

23. The system of claim 21, wherein said data processor is one of a digital signal processor and a microprocessor.

24. A data processing system, comprising:

a data processor for performing data processing operations;

a man/machine interface coupled to said data processor for permitting human interaction therewith;

a multi-bank DRAM having a shared sense amplifier architecture for storing therein data involved in said data processing operations; and a memory controller coupled between said data processor and said DRAM for permitting data transfers therebetween, said memory controller including an input coupled to said data processor for receiving therefrom a data transfer request, an address mapper coupled to said input and responsive to said data transfer request for mapping logical addresses of a logical address sequence associated with said data transfer request into respective physical addresses that defme a physical address sequence that corresponds to the logical address sequence and includes a plurality of pairs of first and second physical addresses that are mutually adjacent addresses in the physical address sequence, said address mapper further for assigning the first and second physical addresses in each of said pairs such that the first physical address points to a first location in a first bank of the DRAM and the second physical address points to a second location in a second bank of the DRAM that differs from and does not share sense amplifiers with the first bank, and an output coupled to said address mapper and said DRAM for controlling the requested data transfer according to said physical address sequence by using the physical addresses of the physical address sequence to access sequentially locations of the DRAM that are respectively pointed to by the physical addresses of the physical address sequence.

25. The system of claim 24, wherein said man/machine interface includes one of a keyboard, a mouse, a video display, and a printer.

\* \* \* \* \*